United States Patent [19]

Miller et al.

[11] Patent Number: 4,610,032
[45] Date of Patent: Sep. 2, 1986

[54] SIS MIXER HAVING THIN FILM WRAP AROUND EDGE CONTACT

[75] Inventors: Ronald E. Miller, Riegelsville, Pa.; Antony A. Stark, Holmdel, N.J.

[73] Assignee: AT&T Bell Laboratories, Murray Hill, N.J.

[21] Appl. No.: 691,943

[22] Filed: Jan. 16, 1985

[51] Int. Cl.[4] .......................... H04B 1/16; H01P 3/08
[52] U.S. Cl. .................................... 455/325; 333/246
[58] Field of Search ...................... 333/247, 246, 238; 455/327, 328, 325; 357/74, 80

[56] References Cited

U.S. PATENT DOCUMENTS

| | | | |
|---|---|---|---|
| 2,874,276 | 2/1959 | Dukes et al. | 455/327 X |
| 3,651,434 | 3/1972 | McGeogh et al. | 333/247 |
| 3,857,115 | 12/1974 | Wisbey | 333/247 |
| 3,886,505 | 5/1975 | Jacobson | 333/247 |
| 3,908,185 | 9/1975 | Martin | 333/247 X |
| 4,000,469 | 12/1976 | McMaster | 455/327 |
| 4,032,849 | 6/1977 | Crysel et al. | 455/327 |
| 4,034,321 | 7/1977 | Ward, Jr. et al. | 333/238 |
| 4,266,206 | 5/1981 | Bedard et al. | 333/246 X |
| 4,293,956 | 10/1981 | Alstatt | 455/327 |
| 4,349,792 | 9/1982 | Scheiner | 333/81 A |
| 4,360,865 | 11/1982 | Yasamura et al. | 333/247 X |
| 4,542,358 | 9/1985 | Boby | 333/246 |

OTHER PUBLICATIONS

"Low-Noise 115-GHz Receiver Using Superconducting Tunnel Junctions Appl. Phys. Lett 43 (8)", Oct. 15, 1983, pp. 786-788, Pan et al.

"Millimeter-Wave Receivers with Subharmonic Pump" by T. F. Master et al. IEEE Trans on Microwave, Dec 1976, vol. MTT-24, No. 12, pp. 948-952.

"Low-Noise, Fixed-Tuned, Broadband Mixer for 200-270 GHz" by J. W. Archer et al. Microwave Journal, Jul. 1984, pp. 135-142.

Primary Examiner—Eugene R. Laroche
Assistant Examiner—Benny Lee
Attorney, Agent, or Firm—Patrick E. Roberts; Robert O. Nimtz

[57] ABSTRACT

A single substrate with a stripline circuit on one of its surfaces for use in a down converting mixer has a thin metallic film deposited utilizing photolithographic techniques onto two free ends: one end with the junction section of the stripline circuit for establishing a ground path with the metal block upon which the substrate rests and the other end with the filter section of the stripline circuit for establishing the intermediate frequency signal path with the inner conductor of a coaxial cable.

7 Claims, 6 Drawing Figures

SIS MIXER HAVING THIN FILM WRAP AROUND EDGE CONTACT

TECHNICAL FIELD

This invention relates to mixers in millimeter-wave receivers and, in particular, to such mixers having a single substrate with wrap-around end contacts.

BACKGROUND OF THE INVENTION

Superconductor-insulator-superconductor (SIS) mixers for use in millimeter-wave receivers are assembled from several parts. The mixer is a metal block in which a dielectric substrate is mounted. On this substrate is the active circuit, a thin metal film. One major difficulty in the fabrication of the SIS mixers is making the electrical contact between the metal block and this thin film. The substrate must be glued in place and then a contact to the ground connection and the intermediate frequencies (IF) connection made using silver paint, wire bonding, or metal loaded epoxy. This is difficult and tedious.. Furthermore, the reliability of the contact is not good, especially since the mixer must be cryogenically cooled for it to work.

SUMMARY OF THE INVENTION

The aforesaid difficulties have been overcome by the use of thin film wrap around end contacts made by photolithographic techniques. The end contacts are formed by depositing a thin layer of conductive metal on a plurality of stripline circuits cut from a single quartz wafer so as to extend the conductive path of the stripline circuits to the ends of the substrate. A substrate with a stripline circuit thereon is inserted into a recess in the metal block of a mixer. One of the thin film metallic ends of the quartz substrate touches a gold plated bellows to provide a conductive path to the inner conductor of a coaxial cable. The other thin film metallic end of the substrate makes contact with a metal block upon which it rests for support within the mixer, thereby providing the ground path.

One advantage of the present invention is the ease with which the substrate bearing the stripline circuit is loaded into the mixer. Because of the thin film contact on ends of the substrate, a ground conductive path is established between the circuit, the end contact and the metal block upon which the substrate is seated, thereby avoiding the prior art method of using silver paint to establish the ground conductive path between the circuit and the metal block after the substrate has been positioned therein.

Whereas, in the prior art, two separate substrates were used—one with the junction stripline circuit, the other with the filter stripline circuit—and these two were bonded together by epoxy cement and silver paint, in the present invention only one substrate is used with both the aforesaid circuits thereon. Whereas in the prior art a gold foil was used around one end of the substrate and silver paint used to connect the gold foil to the filter stripline circuit so as to establish a conductive path between the filter circuit and a gold plated bellows, in the present invention, the gold foil is eliminated by depositing a thin metallic film on the end of the substrate to establish the aforesaid conductive path between the filter circuit and the bellows. The advantage of all this is the reduction of the receiver temperature by a factor of about two. That is, there is a substantial reduction in noise.

DETAILED DESCRIPTION

Figure 1:
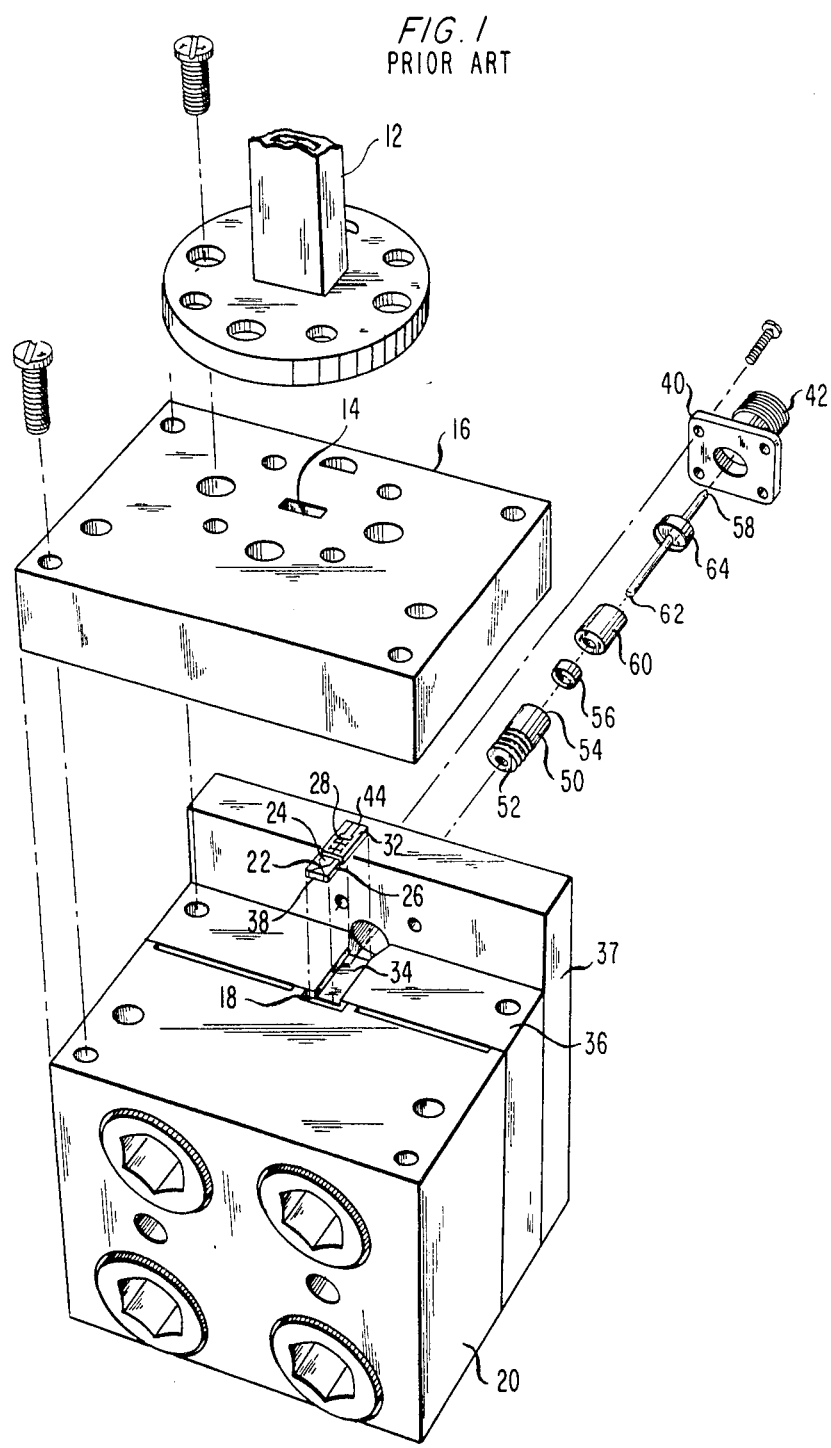
FIG. 1 shows an exploded view of the prior art mixer.

Referring to FIG. 1 there is shown in exploded view details of a prior art mixer. Waves passing through a wave guide 12, through the opening 14 in block 16, through the opening 18 in block 20 are reflected from a backshort (not shown) in a manner known in the art. Electromagnetic waves are coupled by the SIS junction 22 on stripline circuit 24 which adheres to substrate 26. Junction stripline circuit 24 is bonded with silver paint, wire bonding or metal loaded epoxy to filter stripline circuit 28 which has been photolithographically deposited on substrate 32.

When the substrates 26 and 32 are positioned within recess 34 of metal block 36, silver paint is applied to the end 38 of substrate 26 so that the end of junction circuit 22 near edge 38 makes contact with metal block 36 immediately under substrates 26 and 32. A continuous ground path is formed between the junction portion of circuit 24, metal block 36, block 37, plate 40 and the outer sheath of coaxial cable 42. Block 37 projects upwards from block 36 so as to provide an anchor for plate 40. Plate 40 is a flange around coaxial cable 42 and used to align coaxial cable 42 with conducting rod 58 as stated hereinbelow.

A gold foil is wrapped around end 44 of substrate 32 and is bonded to the end of filter circuit 28. Signals pass from the junction circuit 22 across the bonding to filter circuit 28 through the gold foil wrapped on end 44 and then through the connecting circuit to the inner wire of the coaxial connector 42.

The aforesaid connecting circuit comprises gold plated bellows 50 having an end 52 which is bellowed and abuts against the gold foil on end 44 of substrate 32. End 54 of bellows 50 is recessed to receive brass bead 56. The outer surface of brass bead 56 is soldered to the recessed inner surface of bellows 54. The inner surface of brass bead 56 fits over conducting rod 58 and is soldered thereto. TEFLON bead 60 fits over rod 58 and acts as a spacer. The width of brass bead 56 and TEFLON bead 60 exactly equals the length of rod 58 between end 62 and the metallic rim of hermetic feedthrough 64. The signal flows through filter circuit 28, the gold foil at end 44 of substrate 32, bellows 50, brass bead 56 and rod 58 of hermetic feedthrough 64 to the inner conductor of coaxial connector 42.

Figure 2:
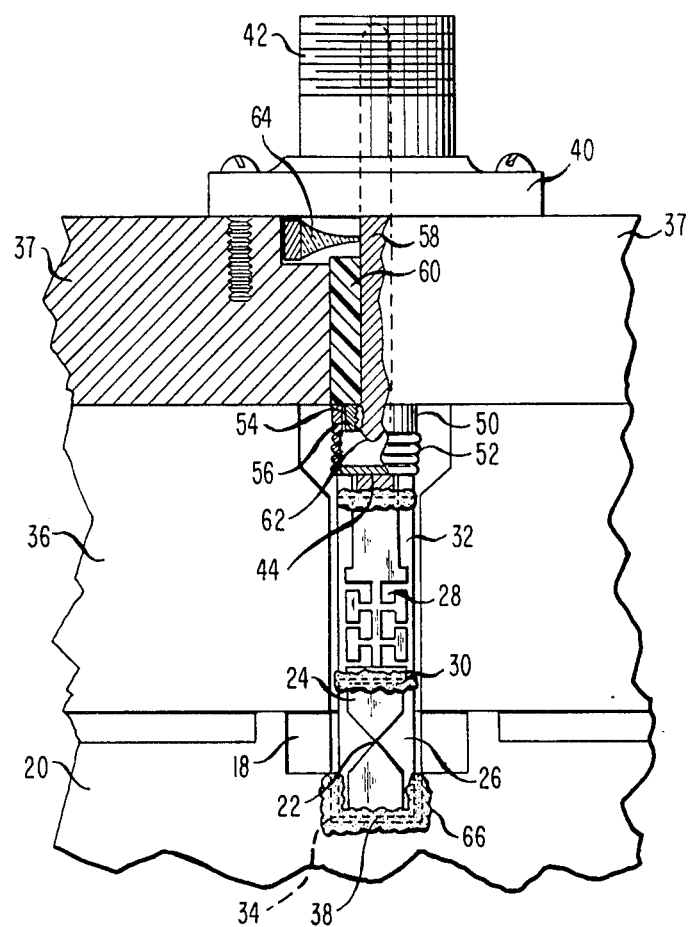
FIG. 2 shows a partially assembled view of the prior art mixer in FIG. 1.

Referring to FIG. 2, there is shown the prior art mixer in the assembled state but with metal block 16 removed to expose the circuit. The gold foil on end 44 permits coaxial cable connector 42 to make contact with filter stripline circuit 28. A problem with this method resides in establishing a conductive path for ground between junction stripline circuit 24 and metal block 36. This is done in the prior art by first positioning substrates 26 and 32 firmly into recess 34 and then bonding end 38 of junction stripline circuit 24 to metal block 36 by silver paint, wire bonding or metal loaded epoxy. This is, however, difficult and tedious and the reliability of the contact is not good, especially because the mixer must be cryogenically cooled for the SIS junction to work.

Figure 3:
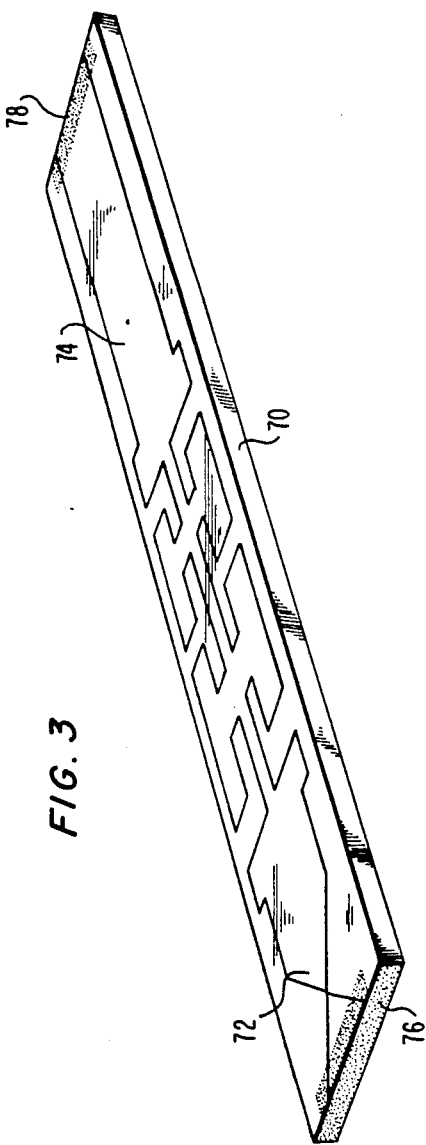
FIG. 3 shows detail of the present invention.

Referring to FIG. 3, there is shown an embodiment of the present invention. There is only one substrate 70 upon which a stripline circuit, comprising both junction circuit 72 and filter circuit 74, is fixed. Ends 76 and 78 of substrate 70 are coated with a thin layer of metal using photolithographic techniques. The metallic coating on end 76 provides an extension of junction circuit 72, thereby avoiding the prior art method of establishing a bond between the stripline circuit and a conducting block by silver paint or the like. Likewise, the metallic coating on end 78 provides an extension of filter circuit 74, thereby avoiding the prior art method of establishing a conductive path by bonding a gold foil to the stripline circuit. The advantages of the present invention are twofold: noise is reduced by a factor of two because the contact resistance and reflectance is made smaller which results in better performance and the substrate can be positioned easily resulting in faster assembly and consistent performance. Because the substrate is mounted without the use of adhesives the substrate and the circuit upon it can be tested non-destructively either before assembly into the mixer, or afterwards by removing it from the mixer, testing it, then re-mounting it into the mixer.

Figure 4:
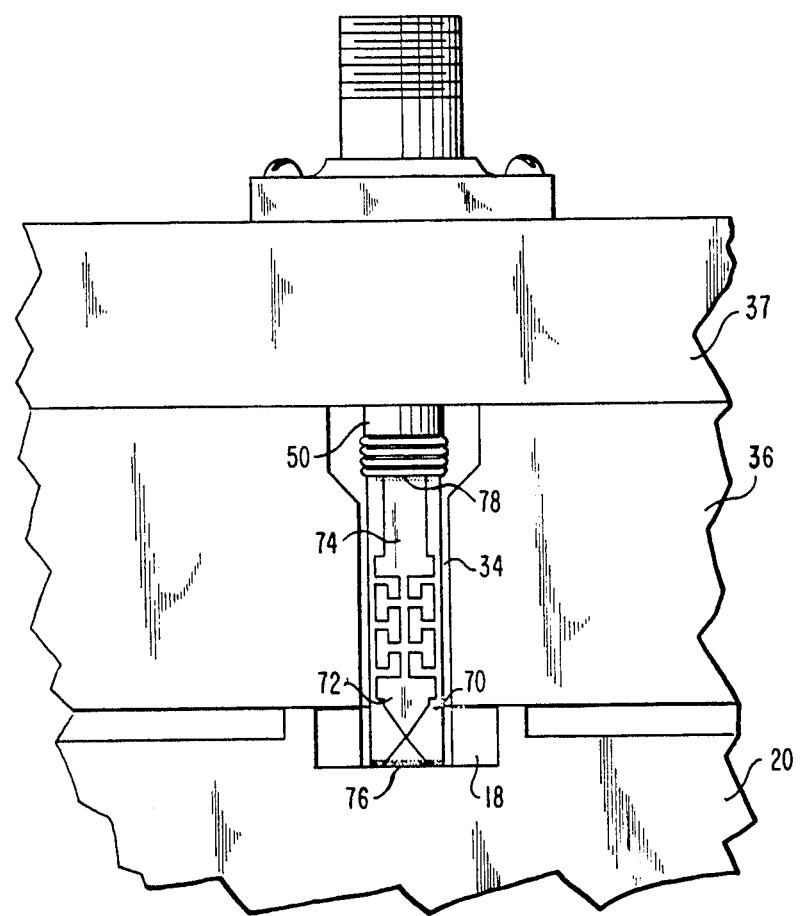
FIG. 4 shows a partially assembled view of the present invention in a mixer.

Referring to FIG. 4, which corresponds to FIG. 2, there is shown substrate 70 embodying the present invention seated within recess 34 of block 36. The same numbers are used to refer to those parts which are not changed by this invention. The metallic coating on end 78 establishes a conductive path between filter stripline circuit 74 and gold plated bellows 50. Likewise, the metallic coating on end 76 establishes a conductive path between junction stripline circuit 72 and metal block 36.

Figure 5:
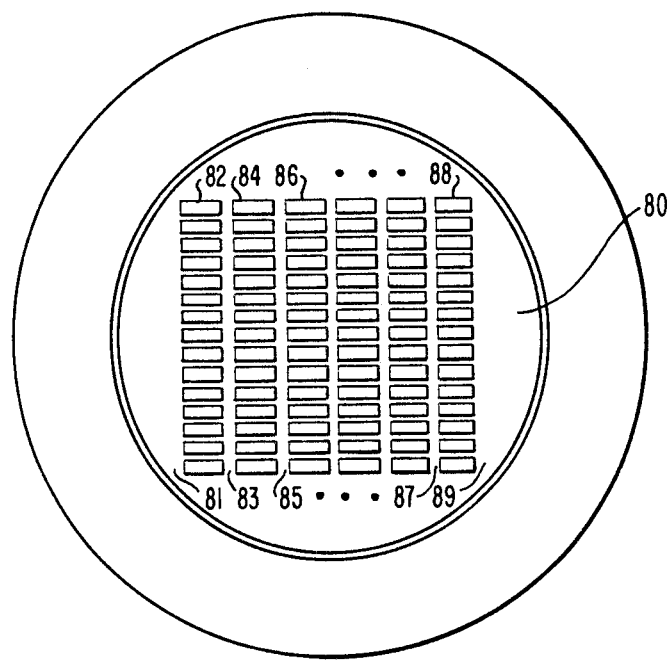
FIG. 5 shows a wafer comprising a plurality of substrates.

Referring to FIG. 5, there is shown a silicon wafer 80 to which a quartz wafer is attached using wax as an adhesive. This quartz wafer is the material of which the stripline circuit substrates are made. Onto this quartz wafer, a plurality of stripline circuits 82, 84, 86 . . . 88 are printed using techniques which are well known in the art. Thereafter, channels 81, 83, 85 . . . 89 are cut between the circuits, exposing the end surfaces of the substrates. The channels are wider than a single cut made by a diamond dicing saw. The channels are formed by making two cuts with the dicing saw and removing the strip of quartz between them with a sharp implement. Single cuts are made in the perpendicular direction with the dicing saw, in order to separate the quartz wafer into individual substrates. Each substrate bears a circuit. The substrates remain glued to the silicon wafer. The exposed end surfaces are cleaned by some suitable solvent like trichloroethylene. Then a conductive metal is deposited on the end surfaces of the substrates by using photolithographic techniques so as to extend the conductive surface of stripline circuits 82, 84, 86 . . . 88 around the edges, onto the newly-cut end surfaces.

The photolithography process, which is well known, is described briefly hereinbelow. Photoresist is deposited on the entire surface, using known techniques. Even the end surfaces are coated with the photoresist. A mask is then placed between an ultraviolet light source and the top surface so as to cover the circuits on the individual pieces but to allow the ultraviolet light to expose the photoresist on the end surfaces and the ends of the top surface nearest the ends. The photoresist which is exposed is then developed, removing photoresist from the end surfaces and the adjacent area of the top surface, but leaving a protective layer of photoresist covering the sides and the remainder of the top surface.

Figure 6:
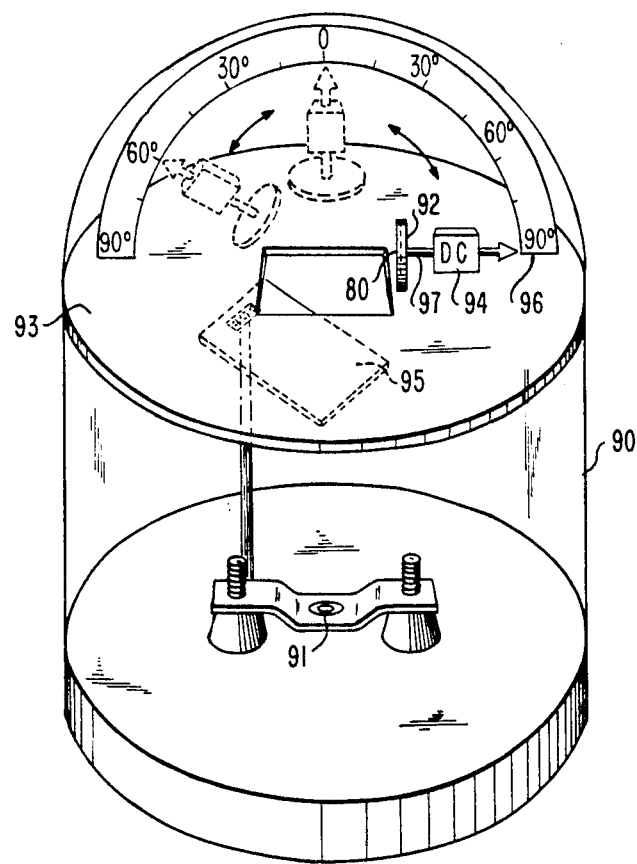
FIG. 6 shows a bell jar which is used for making the present invention.

Referring to FIG. 6, there is shown bell jar 90. Wafer 80 is affixed to a plate 92 which can be caused to rotate around the axis defined by the motor shaft, 97, using a direct current (d.c.) motor 94 under control of a circuit which is not shown in order to simplify the description. The assembly comprising the wafer 80, the plate 92, the motor shaft 97 and the motor 94, can be positioned at any of several angles in a vertical plane, shown by the broken lines for visualization, using a system of hand-operated levers, which are not shown in order to simplify the description. The scale 96 enables an operator to see the position of wafer 80. A small amount of metal is placed in tungsten boat 91 and then electrically heated in a vacuum. The metal which evaporates is permitted to enter chamber 93 by opening the shutter 95. The metal is deposited onto the entire exposed surface of the wafer. By the action of the d.c. motor and the levers, the wafer is caused to move so that metal is deposited at a variety of angles, so as to assure a sufficiently thick coating on the end surfaces. Except for the bottom surface which is glued to the silicon wafer 80, all the surfaces of the substrate are covered with a thin film of metal. After a predetermined period, the wafer is removed from the bell jar and treated with a solvent such as acetone to remove the photoresist from the circuits on the wafer. This also removes the unwanted parts of the metal film from the top and sides of the substrate. The individual stripline circuits are then separated from the silicon wafer, by dissolving the wax cement in a suitable solvent such as trichloroethylene. The circuits are ready for immediate use in a mixer as described hereinabove.

What is claimed is:

1. A substrate for use in a mixer, said substrate comprising an elongate conductive stripline circuit deposited thereon having first and second ends, said first and second ends having a thin metallic coating applied thereto using photolithographic techniques so as to extend the conductive path of said stripline circuit over the edges of said substrate.

2. The substrate of claim 1 wherein said substrate is made from quartz.

3. The substrate of claim 2 wherein said circuit comprises a superconductor-insulator-superconductor junction and a filter, said junction being adjacent to said first end and said filter being adjacent to said second end.

4. The quartz substrate of claim 3 wherein said metallic coating on said first end establishes a ground conductive path between the junction end of said stripline circuit and a metallic block upon which said substrate is seated.

5. The quartz substrate of claim 3 wherein said metallic coating on said second end establishes an intermediate frequency signal path between the filter end of said stripline circuit and the inner conductor of a coaxial cable.

6. The quartz substrate of claim 2 wherein said thin metallic coating has a thickness within a range from 700 Angstroms to 5000 Angstroms.

7. In a millimeter-wave receiver comprising a mixer for converting signals from a first predetermined band of frequencies received from a waveguide, to a second predetermined band of frequencies for transmission via a coaxial cable, an improved quartz substrate comprising a stripline circuit disposed thereon having a superconductor-insulator-superconductor junction stripline section and a filter stripline section, said improvement comprising a thin metallic film deposited, using photolithographic techniques, onto two free ends of said stripline circuit, and onto said substrate near said free ends. one of said free ends being the junction stripline section's end and the other free end being the filter section's end of said stripline circuit, said thin metallic film having a thickness in the range from 700 Angstroms to 5000 Angstroms, said thin metallic film on said junction stripline section's end establishing a ground connection between said stripline circuit and a metal block upon which said substrate rests, and said thin metallic film on said filter section's end establishing an intermediate frequency signal path between said stripline circuit and the inner conductor of said coaxial cable.

* * * * *